US007027794B2

(12) United States Patent
Yokota

(10) Patent No.: US 7,027,794 B2

(45) Date of Patent: Apr. 11, 2006

(54) RADIO RECEIVER AND RADIO COMMUNICATION SYSTEM

(75) Inventor: Yasuhiro Yokota, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 32 days.

(21) Appl. No.: 10/281,046

(22) Filed: Oct. 23, 2002

(65) Prior Publication Data

US 2003/0050034 A1 Mar. 13, 2003

Related U.S. Application Data

(63) Continuation of application No. PCT/JP00/02754, filed on Apr. 26, 2000.

(51) Int. Cl.
*H04B 1/26* (2006.01)

(52) U.S. Cl. ...................... 455/323; 455/326; 455/337; 455/338; 455/339

(58) Field of Classification Search ................ 455/323, 455/326, 337, 338, 339, 341
See application file for complete search history.

(56) References Cited

U.S. PATENT DOCUMENTS

| | | | | |
|---|---|---|---|---|
| 5,548,831 | A | 8/1996 | Bijker | |
| 5,909,644 | A | 6/1999 | Tomiyama | |
| 6,009,126 | A | 12/1999 | Van Bezooijen | |
| 6,178,320 | B1 * | 1/2001 | Richards et al. | 455/326 |
| 6,625,424 | B1 * | 9/2003 | Mohindra | 455/84 |

FOREIGN PATENT DOCUMENTS

| | | |
|---|---|---|
| AT | 180606 | 12/1954 |
| EP | 0 576 078 A1 | 12/1993 |
| GB | 2 308 518 | 6/1997 |
| JP | 1-274518 | 11/1989 |
| JP | 5-316158 | 11/1993 |
| JP | 6-77852 | 3/1994 |
| JP | 8-204765 | 8/1996 |
| JP | 9-172384 | 6/1997 |
| JP | 9-214385 | 8/1997 |
| JP | 10-070482 | 3/1998 |
| JP | 2005-500317 | 1/2000 |
| WO | 98/10523 | 3/1998 |

* cited by examiner

*Primary Examiner*—Joseph Feild
*Assistant Examiner*—Huy D. Nguyen
(74) *Attorney, Agent, or Firm*—Katten Muchin Rosenman LLP

(57) ABSTRACT

The cutoff frequency is set high in order to prevent suppression of low-frequency components so that high-quality reception control of a radio signal can be realized. A radio signal amplifier unit amplifies a received radio signal and results in an amplified signal. A frequency conversion unit mixes the amplified signal with a local oscillation signal to thereby convert the radio signal having a radio frequency signal into the radio signal having an intermediate frequency signal, resulting in an intermediate frequency signal. A frequency shift control unit shifts the intermediate frequency signal towards the upper part of the frequency band. A frequency inversion unit inverts a low-frequency side of the intermediate frequency signal towards the upper part of the frequency band and inverts a high-frequency side thereof towards a lower part thereof. An AC coupling unit is provided at an output side of the frequency control unit. A radio signal demodulating unit demodulates an output signal obtained via the AC coupling means.

7 Claims, 15 Drawing Sheets

RADIO RECEIVER AND RADIO COMMUNICATION SYSTEM

This application is a continuing application, filed under 35 U.S.C. § 111(a), of International Application PCT/JP00/02754, filed on Apr. 26, 2000.

BACKGROUND OF THE INVENTION (1) Field of the Invention

The present invention relates to radio receivers and radio communication systems, and more particularly, to a radio receiver that performs reception control of radio signals and a radio communication system that performs communication control of a radio signal.

(2) Description of the Related Art

Generally, PSK (Phase Shift Keying) that changes the phase of a carrier wave is used in digital modulation. As compared to ASK (Amplitude Shift Keying), PSK has the smallest C/N (Carrier-to-Noise) for the same code error ratio.

Recently, the zero-IF (Intermediate Frequency) system has widely been used, in which the received radio signal and a locally oscillated signal of the same frequency as that of the received radio signal are mixed so that an intermediate frequency (zero IF) at which the central frequency fo of the received radio signal is shifted to a frequency of zero (fo=0). The zero-IF signal is then amplified.

FIG. 14 shows the concept of the zero-IF system. The left side of the figure shows an energy distribution of a received radio signal, and the right side thereof shows an energy distribution of the zero-IF signal. The horizontal axes denote the frequency, and the vertical axes denote power. The received radio signal is frequency-converted into the zero-IF signal, which has a band width of ±1 MHz about the center of f0=0 MHz.

The zero-IF system does not provisionally convert the received radio signal into the intermediate frequency but directly converts it into the baseband signal. Thus, the zero-IF system has advantages such that the channel selection filter can be implemented in the baseband and an image wave does not occur at the time of reception of spurious signals.

FIG. 15 shows a structure of a conventional radio receiver. A radio receiver 100 is a QPSK (Quadrature PSK) receiver that employs the zero-IF system, and has two split systems that respectively generate an I (In phase) signal and a Q signal (Quadrature phase).

The radio receiver 100 includes an RFA (Radio Frequency Amplifier) 101 and a frequency converter 110. The frequency converter 110 is made up of an LO (Local Oscillator) 111, a π/2 phase shifter 112 and mixers 113*a* and 113*b*.

The I signal generating system that follows the frequency converter 110 is made up of a LPF (low-pass filter) 102*a*, an AMP (Amplifier) 103*a*, couplers (capacitor) 104*a*, 106*a*, a VGC (Voltage Gain Controller) 105*a*, an A/D (Analog-to-Digital) converter 107*a*, a DEM (Demodulator) 108*a*, and an AGC (Automatic Gain Controller) 109*a*.

Similarly, the Q signal generating system is made up of a LPF 102*b*, an AMP 103*b*, couplers 104*b*, 106*b*, a VGC 105*b*, an A/D converter 107*b*, a DEM 108*b*, an AGC 109*b*.

In operation, the RFA 101 amplifies the received radio signal. The LO 111 of the frequency converter 110 oscillates a local signal of the same frequency as that of the received radio signal. In the I-signal generating system, the mixer 113*a* mixes the signal that has been amplified by the RFA 101 and the local oscillation signal from the LO 111, and thus generates a zero-IF signal.

Then, the signal is filtered and gained by the LPF 102*a* and the AMP 103*a*, and the dc component thereof is then cut off by the coupler 104*a*. The voltage gain of the signal is set at the level that matches the dynamic range of the A/D converter 107*a*, and the remaining dc component thereof is cut off by the coupler 106*a*.

The signal is converted into a digital signal by the A/D converter 107*a*, and is demodulated into the I signal by the DEM 108*a*. The level setting of the voltage gain of the VGC 105*a* is adjusted by feedback control from the AGC 109*a*.

In the Q signal system, the oscillation frequency from the LO 111 is shifted by π/2 by the π/2 phase shifter 112. The mixer 113*b* mixes the amplified signal from the RFA 101 and the π/2-phase-shifted oscillation signal. This mixing results in the zero-IF signal. Then, the same process as that for the I signal is performed, so that the Q signal can be generated.

Here, it is impossible to apply the zero-IF signals that have been amplified by the AMPs 103*a* and 103*b* to the VGCs 105*a* and 105*b* without the couplers 104*a* and 104*b*, respectively.

This is because the VGCs 105*a* and 105*b* is required to have an amplification factor of one million times (120 dB) (a few μV to a few V). A variation in the operating point as small as a few μV may cause cutoff or saturation, such as variation resulting from variation in environment and such as variation in the receive electric field intensity or temperature and/or differences resulting from the non-linearity of the elements. The AGCs 109*a* and 109*b* feed back the above-mentioned variation, so that the variation in the operating point may be further emphasized.

Taking into consideration the above, the radio receiver 100 is designed so that the systems that follow the AMPs 103*a* and 103*b* use the couplers 104*a*, 104*b*, 106*a* and 106*b* for cutting off the DC components and are AC-coupled with a processing part of the following stage.

However, in the AC-coupled of the conventional radio receiver, it is preferable to cut off the DC components of the Zero-IF signal to suppress DC fluctuation. It is to be noted that there is a lot of information at the frequency of the zero-IF signal and frequencies close thereto. Therefore it is desired to pass such information to the processing part of the following stage as much as possible. This causes complexity in optimal design.

That is, if the cutoff frequency is lowered, the receiver will be considerably affected by dc fluctuation. In contrast, if the cutoff frequency is raised, energy of the low-frequency component is cutoff highly and, namely, information will be lost greatly.

SUMMARY OF THE INVENTION

Taking into consideration the above, it is an object of the present invention to provide a radio receiver in which the cutoff frequency is set high in order to prevent suppression of low-frequency components so that high-quality reception control of a radio signal can be realized.

Another object of the present invention is to provide a radio communication system in which the cutoff frequency is set high in order to prevent suppression of low-frequency components so that high-quality reception control of a radio signal can be realized.

The above objects of the present invention are achieved by a radio receiver performing a reception control of a radio signal. The radio receiver includes: radio signal amplifier means for amplifying a received radio signal and generating an amplified signal; frequency converter means for mixing the amplified signal with a local oscillation signal to thereby convert the radio signal having a radio frequency into the radio signal having an intermediate frequency; frequency control means, including at least one of frequency shift control means for shifting the intermediate frequency signal towards an upper part of a frequency band and frequency inversion control means for inverting a low-frequency side of the intermediate frequency signal towards the upper part of the frequency band and inverting a high-frequency side thereof towards a lower part thereof, for performing frequency control of the intermediate frequency signal; AC coupling means provided at an output side of the frequency control means; and radio signal demodulating means for demodulating an output signal obtained via the AC coupling means.

The above objects of the present invention are also achieved by a radio communication system performing a communication control of a radio signal. The system includes: a radio base station having a first radio transmission unit and a first radio reception unit; and a mobile station having a second radio transmission unit and a second radio reception unit. Each of the first and second radio transmission units modulates a signal and transmits a radio signal. Each of the first and second radio reception units includes: radio signal amplifier means for amplifying a received radio signal and generating an amplified signal; frequency converter means for mixing the amplified signal with a local oscillation signal to thereby convert the radio signal having a radio frequency into the radio signal having an intermediate frequency; frequency control means, including at least one of frequency shift control means for shifting the intermediate frequency signal towards an upper part of a frequency band and frequency inversion control means for inverting a low-frequency side of the intermediate frequency signal towards the upper part of the frequency band and inverting a high-frequency side thereof towards a lower part thereof, for performing frequency control of the intermediate frequency signal; AC coupling means provided at an output side of the frequency control means; and radio signal demodulating means for demodulating an output signal obtained via the AC coupling means.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
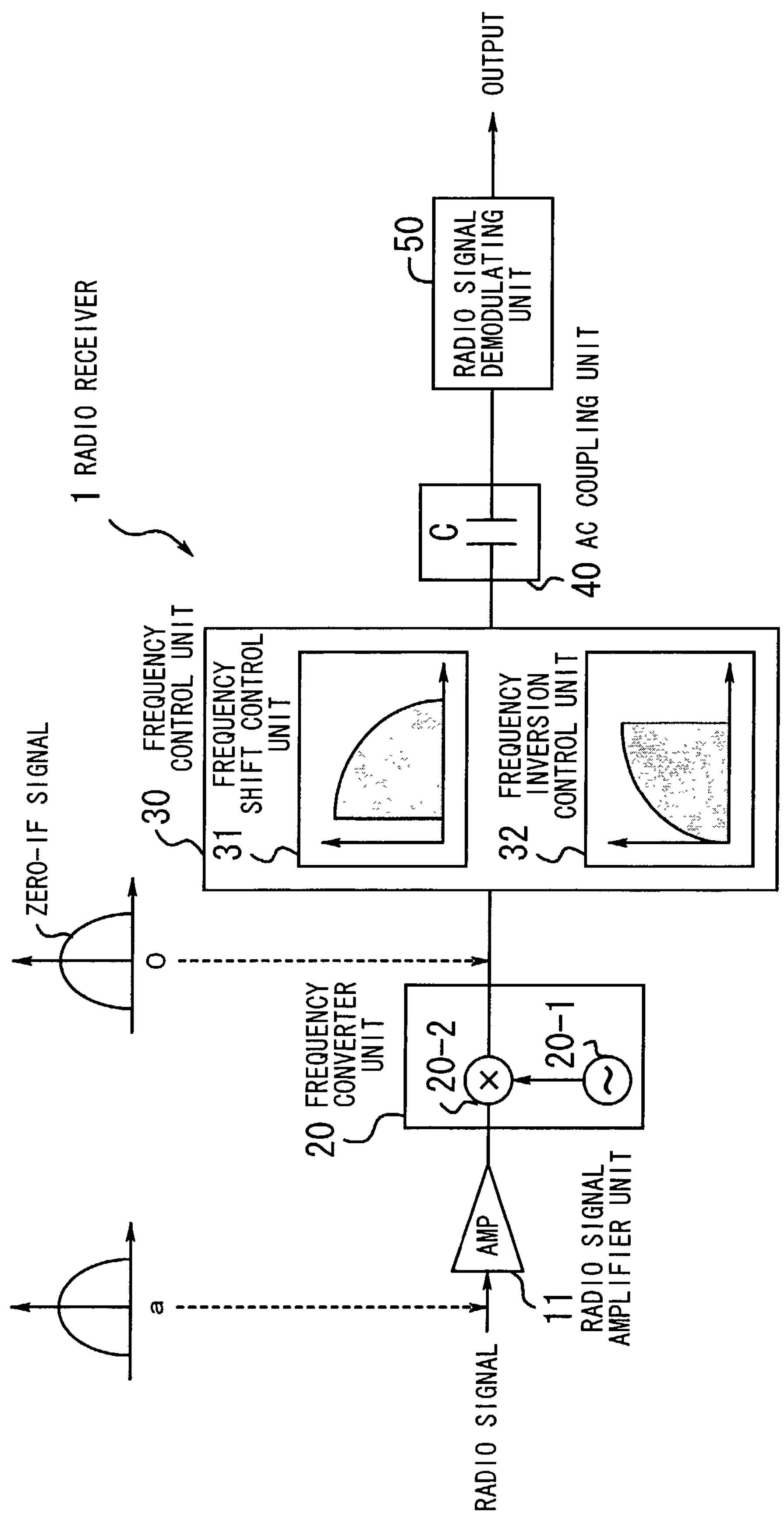
FIG. 1 shows the principles of the present invention.

A description will now be given of embodiments of the present invention with reference to the accompanying drawings. FIG. 1 is a view of the principles of a radio receiver according to the present invention. A radio receiver 1 performs reception control of radio signals.

A radio signal amplifier unit 11 amplifies a received radio signal. A frequency converter unit 20 is made up of an LO (Local Oscillator) 20-1 and a mixer 20-2.

Figure 14:
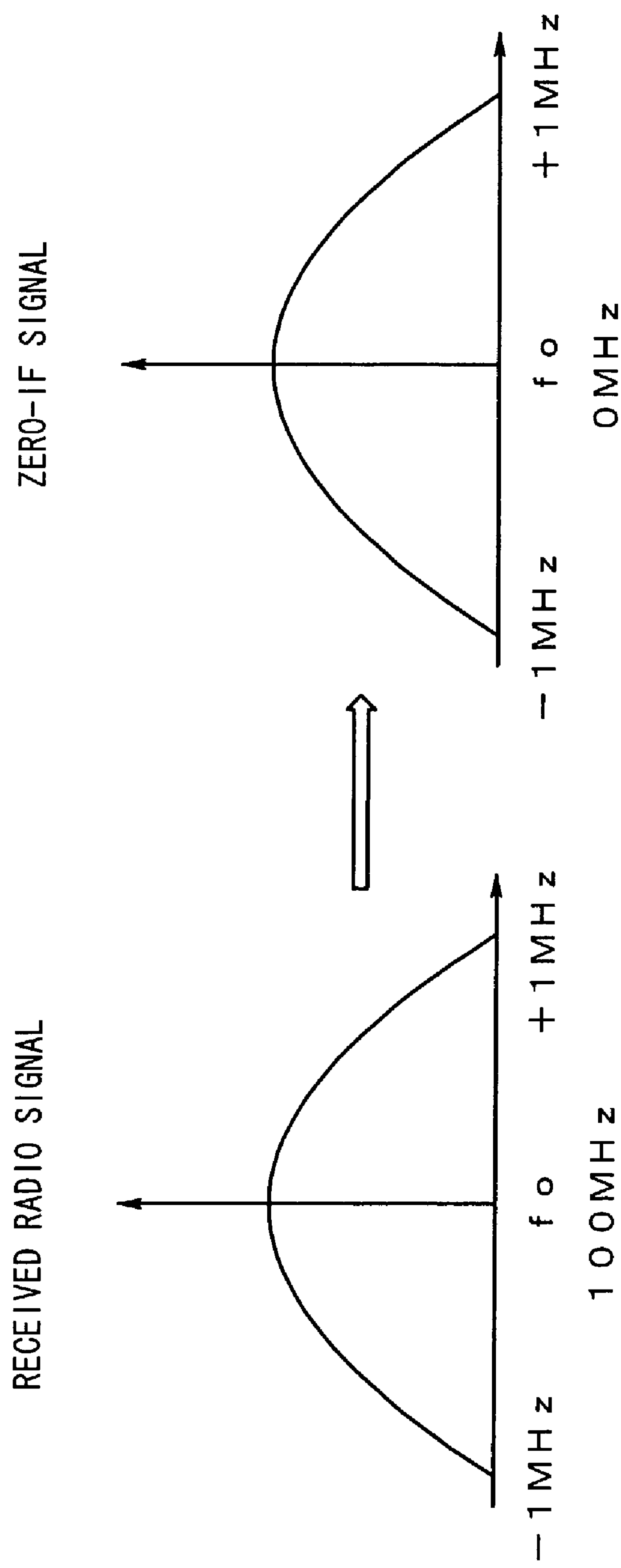
FIG. 14 is a diagram that shows the concepts of the zero-IF system.

The mixer 20-2 mixes the amplified signal from the radio signal amplifier unit 11 and a local oscillation signal from the LO 20-1 to thereby convert the radio signal having a radio frequency into the radio signal having an intermediate frequency, and produces a resultant intermediate frequency signal. The intermediate frequency signal thus generated in the present embodiment is the zero-IF signal, which has been described with reference to FIG. 14. In FIG. 1, the radio signal of a frequency a is converted into the zero-IF signal. Thus, the LO 20-1 oscillates the signal of the same frequency as that of the received radio signal.

A frequency control unit 30 includes at least one of a frequency shift control unit 31 and a frequency inversion control unit 32, and performs the frequency control of the zero-IF signal. The frequency shift unit 31 shifts the zero-IF signal towards the upper part of the frequency band, and results in a frequency-shifted signal. The frequency inversion control unit 32 inverts a low-frequency side of the shifted zero-IF signal towards an upper part of the frequency band and a high-frequency side of the shifted zero-IF signal towards a lower part thereof, so that a frequency-inverted signal can be produced. The details of the above frequency inversion control will be described later with reference to FIGS. 2 through 5.

The output signal of the frequency control unit 30 is one of the frequency-shifted signal, the frequency-inverted signal and the frequency-shifted/inverted signal that is produced by using both the frequency shift control and the frequency inverting control. When the output signal of the frequency control unit 30 is called without discriminating the above three signals from one another, it is called frequency-controlled signal.

An AC coupling unit 40 may be a capacitor C, and cuts off the DC component of the frequency-controlled signal at a high cutoff frequency, and couples the frequency control unit 30 to the next stage in AC fashion. A radio signal frequency demodulator unit 50 adaptively sets the voltage gain of the output signal of the AC coupling unit 40, and performs the A/D conversion for demodulation.

Figure 2:
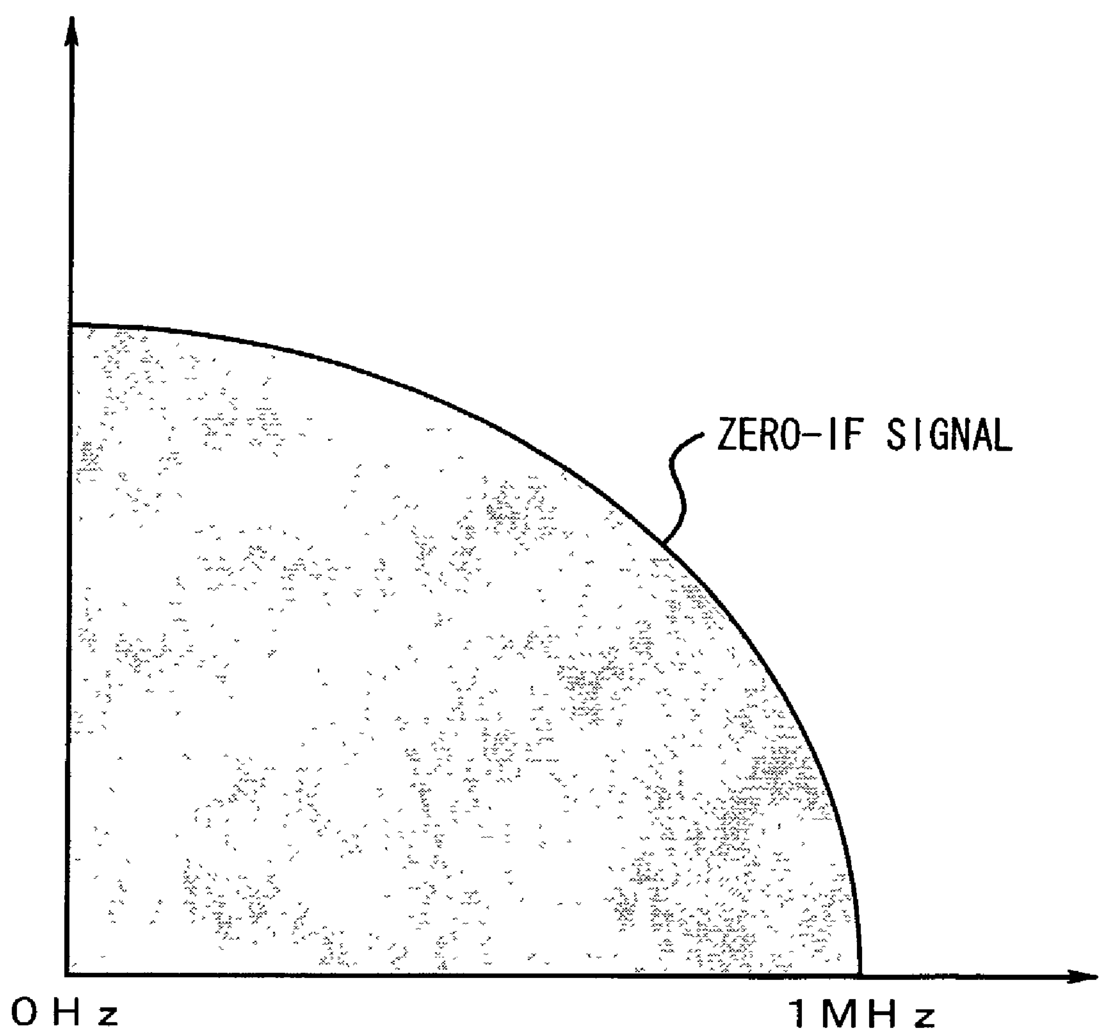
FIG. 2 shows an energy distribution of a zero-IF signal.

Next, the energy distribution is described with reference to FIGS. 2 through 5. FIG. 2 shows an energy distribution of the zero-IF signal, which the horizontal axis denotes frequency and the vertical axis denotes power.

The zero-IF signal has a band width of +1 MHz that extends upwards from the frequency fo=f 0 Hz. It can be seen from the figure that energy of the zero-IF signal concentrates on the DC component and low-frequency components close thereto, while there the energy of high-frequency components is not much.

Thus, if the zero-IF signal having the above energy distribution is applied to the AC coupling unit 40, it is required to set the cutoff frequency of the AC coupling unit 40 at a high frequency (in order to suppress DC fluctuation as has been described). If not, the energy of the low-frequency components will be lost, and the necessary quantity of information will be lost.

Figure 3:
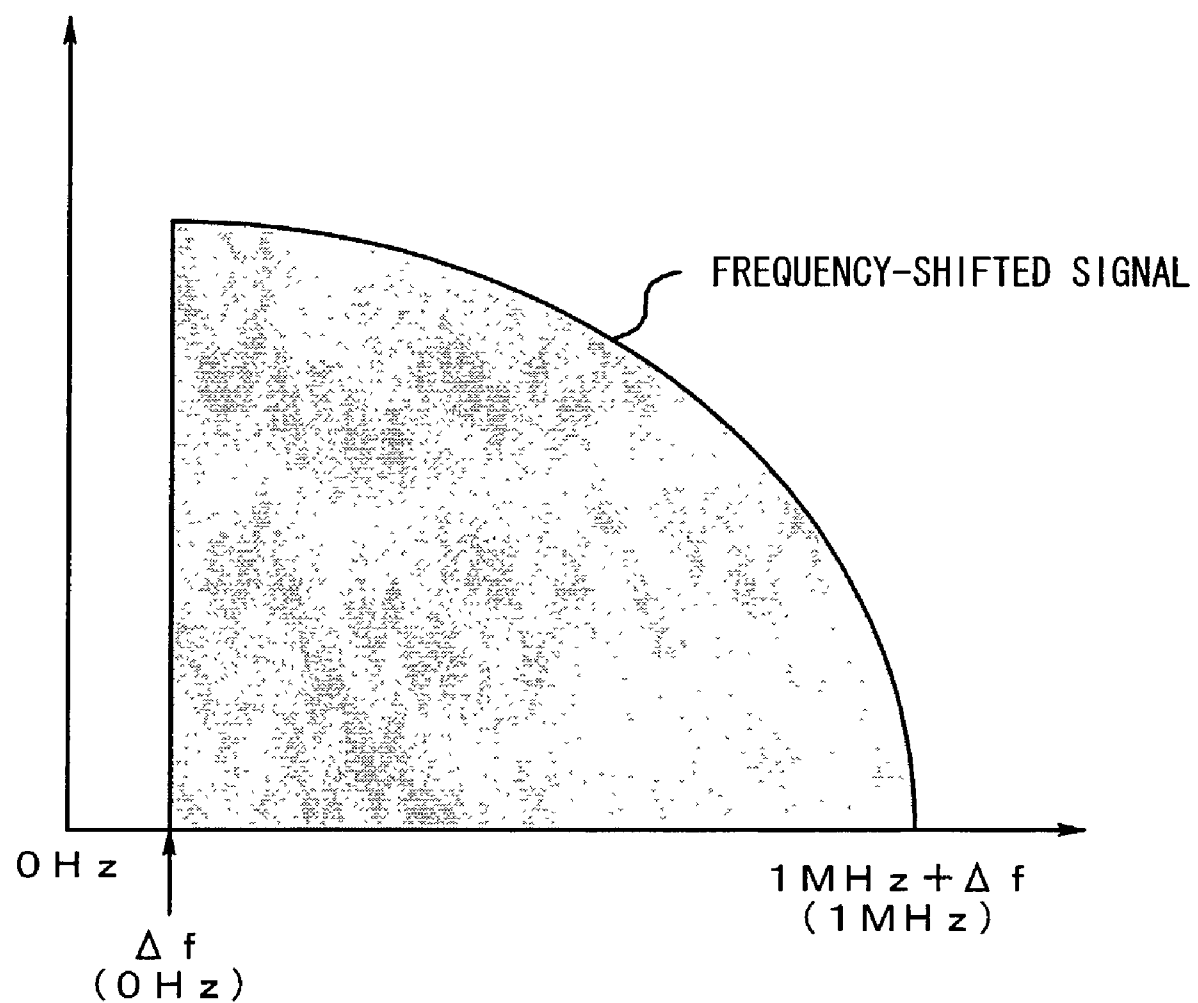
FIG. 3 shows an energy distribution of a frequency-shifted signal.

FIG. 3 shows an energy distribution of the frequency-shifted signal, in which the horizontal axis denotes frequency and the vertical axis denotes power. The frequency-shifted signal is obtained by shifting the zero-IF signal by Δf upwards. The numerical values in parentheses denote the original values before the frequency control.

In FIG. 3, by subjecting the zero-IF signal to the frequency shift control, it is possible to avoid loss of energy due to AC coupling even when the AC coupling unit 40 is set at a high cutoff frequency. It is therefore possible to set the AC coupling unit 40 at a high cutoff frequency useful to suppress DC fluctuation and to suppress loss of information at minimum.

Figure 4:
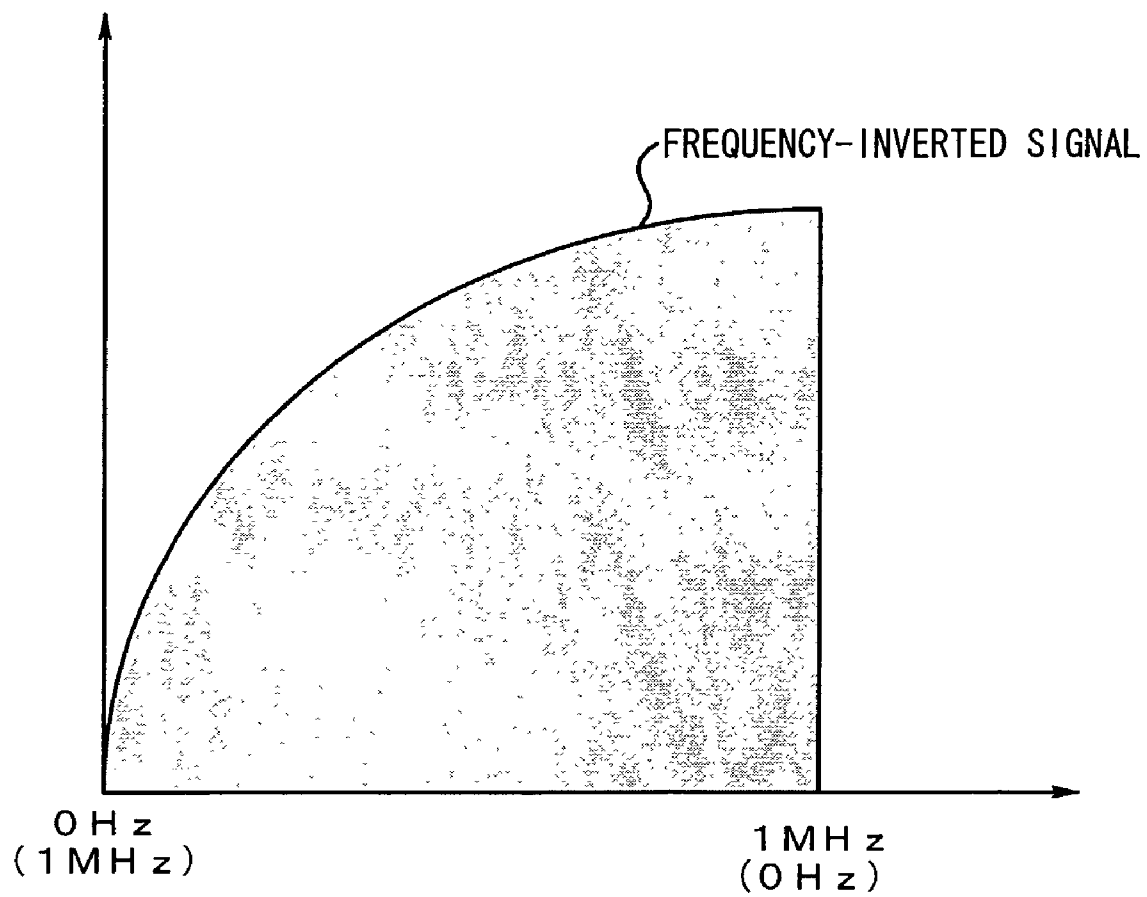
FIG. 4 shows an energy distribution of a frequency-inverted signal.

FIG. 4 shows an energy distribution of the frequency-inverted signal, in which the horizontal axis denotes frequency and the vertical axis denotes power. The frequency-inverted signal is obtained by inverting the zero-IF signal so that the low-frequency side thereof including the DC component inverts towards the upper part of the frequency band and the high-frequency side converts towards the lower part thereof. The numerical values in parentheses denote the original values before the frequency control.

In FIG. 4, by subjecting the zero-IF signal to the frequency inversion control, it is possible to avoid loss of energy due to AC coupling even when the AC coupling unit 40 is set at a high cutoff frequency. It is therefore possible to set the AC coupling unit 40 at a high cutoff frequency useful to suppress DC fluctuation and to suppress loss of information at minimum.

Figure 5:
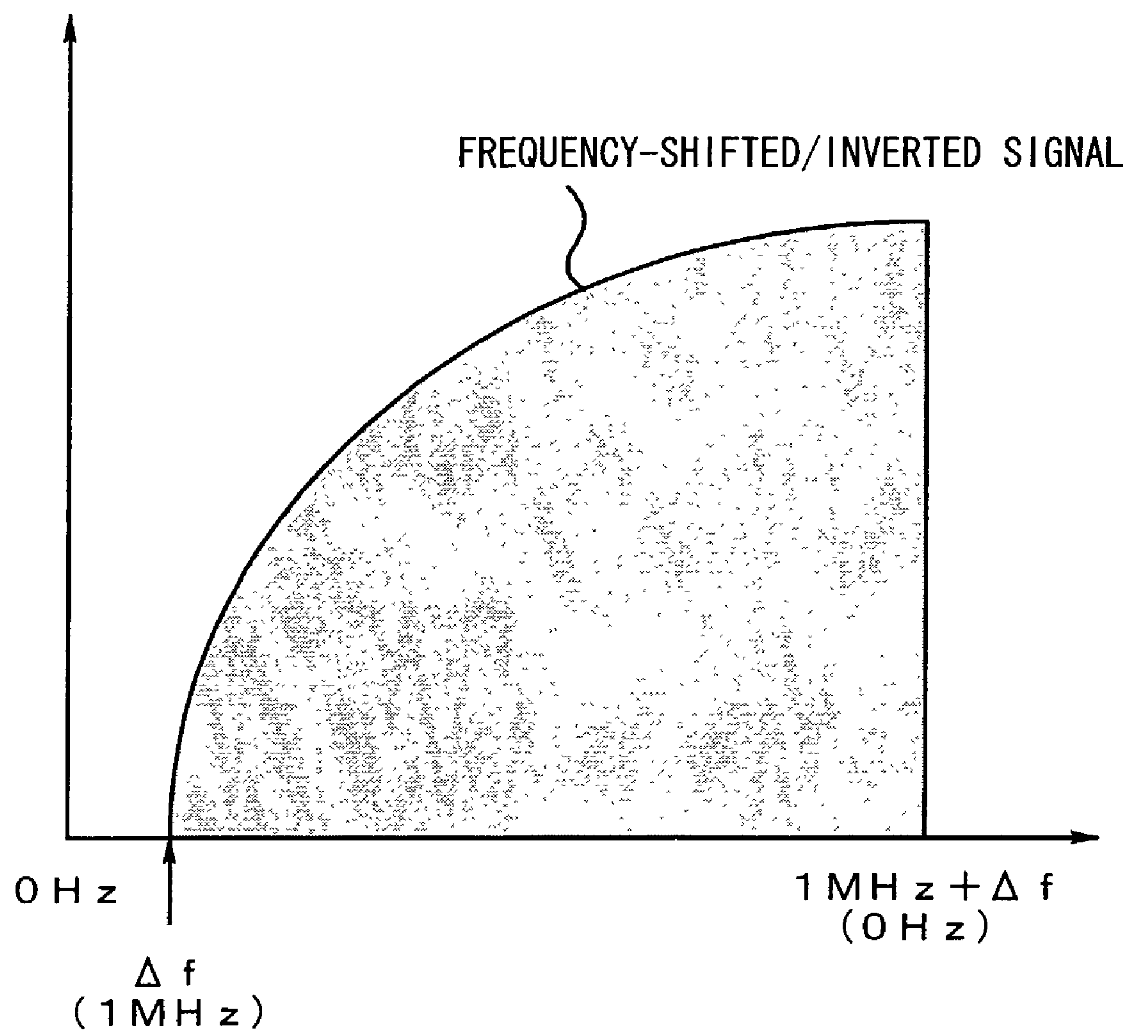
FIG. 5 shows an energy distribution of a frequency-shifted/inverted signal.

FIG. 5 shows an energy distribution of a frequency-sifted/inverted signal, in which the horizontal axis denotes frequency and the vertical axis denotes power. The frequency sifted/inverted signal is obtained by shifting the zero-IF signal by Δf upwards so that the low-frequency side thereof including the DC component inverts towards the upper part of the frequency band and the high-frequency side converts towards the lower part thereof.

In FIG. 5, by subjecting the frequency-sifted/inverted signal to the combination of the frequency shift control and frequency inversion control, it is possible to avoid loss of energy due to AC coupling even when the AC coupling unit 40 is set at a high cutoff frequency. It is therefore possible to set the AC coupling unit 40 at a high cutoff frequency useful to suppress DC fluctuation and to suppress loss of information at minimum.

Figure 6:
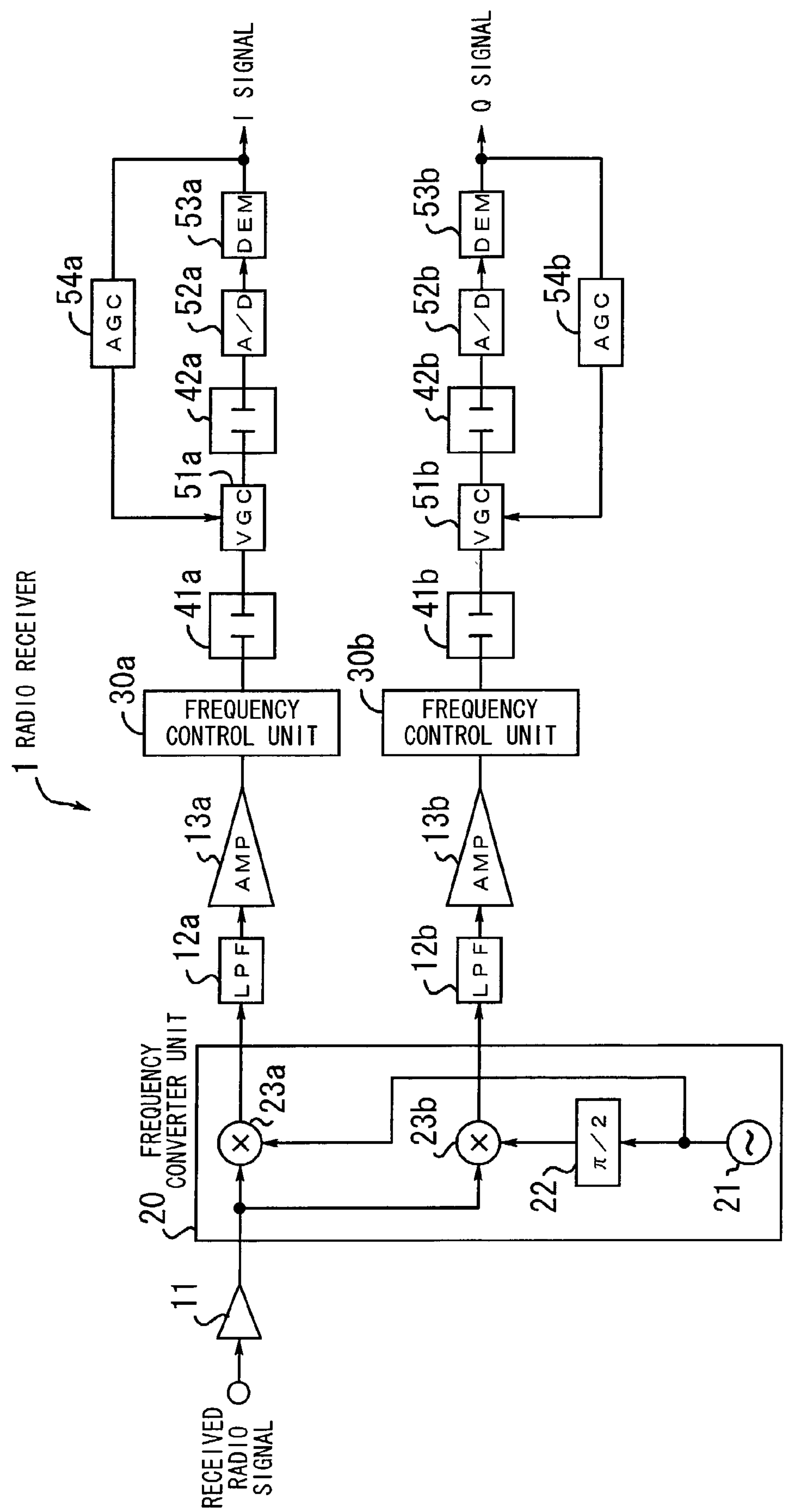
FIG. 6 is a diagram of a radio receiver.

A description will now be given of a structure of the radio receiver 1 of the present invention. FIG. 6 shows a structure of the radio receiver 1, which is a QPSK receiver that employs the zero-IF system and is composed of two circuitry systems that produce the I signal in phase and Q signal orthogonal thereto from the QPSK-modulated wave.

The radio receiver 1 includes a radio signal amplifier unit 11 and a frequency converter unit 20. The frequency converter unit 20 is made up of an LO 21, a π/2 phase shifter 22, and mixers 23*a* and 23*b*.

An I-signal generating system following the frequency converter unit 20 is made up of a LPF (Low-Pass Filter) 12*a*, an AMP (Amplifier) 13*a*, a frequency control unit 30*a*, AC coupling units 41*a* and 42*a*, a VGC (Voltage Gain Controller) 51*a*, an A/D converter 52*a*, a DEM (Demodulator) 53*a*, and an AGC (Automatic Gain Controller) 54*a*. The VGC 51*a*, A/D converter 52*a*, DEM 53*a* and AGC 54*a* are contained in the radio signal demodulator unit 50.

Similarly, a Q-signal generating system is made up of an LPF 12*b*, an AMP 13*b*, a frequency control unit 30*b*, AC coupling units 41*b* and 42*b*, a VGC 51*b*, an A/D converter 52*b*, a DEM 53*b* and an AGC 54*b*. The VGC 51*b*, A/D converter 52*b*, DEM 53*b* and AGC 54*b* are contained in the radio frequency demodulator unit 50.

In operation, the radio signal amplifier unit 11 amplifies the received radio signal. The LO 21 of the frequency converter unit 20 oscillates the same frequency as that of the radio signal. In the I-signal generating system, the mixer 23*a* mixes the signal from the radio signal amplifier unit 11 and the oscillation signal from the LO 21 with each other, and results in the zero-IF signal.

Then, noise in the zero-IF signal is reduced by the LPF 12*a* and is highly amplified by the AMP 13*a*. The resultant signal is frequency-converted by the frequency converter unit 41*a*, so that a frequency-control signal can be produced. The AC coupling unit 41*a* cuts off the DC component of the frequency-controlled signal. The voltage gain of the signal is set at the level that matches the dynamic range of the A/D converter 52*a*, and the remaining DC component thereof is cut off by the AC coupler 42*a*.

The frequency-controlled signal is converted into the digital signal by the A/D converter 52*a*, and is demodulated by the DEM 53*a* so that the I signal can be produced. The level setting of the voltage gain of the VGC 51*a* is adjusted by the feedback control from the AGC 54*a*.

In the Q-signal generating system, the oscillation signal from the LO 21 is phase-shifted by π/2 by the π/2 phase shifter 22. The mixer 23*b* mixes the amplified signal from the radio signal amplifier unit 11 and the π/2 phase-shifted oscillation signal, and results in the zero-IF signal. Then, the same process as that for the I signal is performed, so that the Q signal can be produced.

Figure 15:
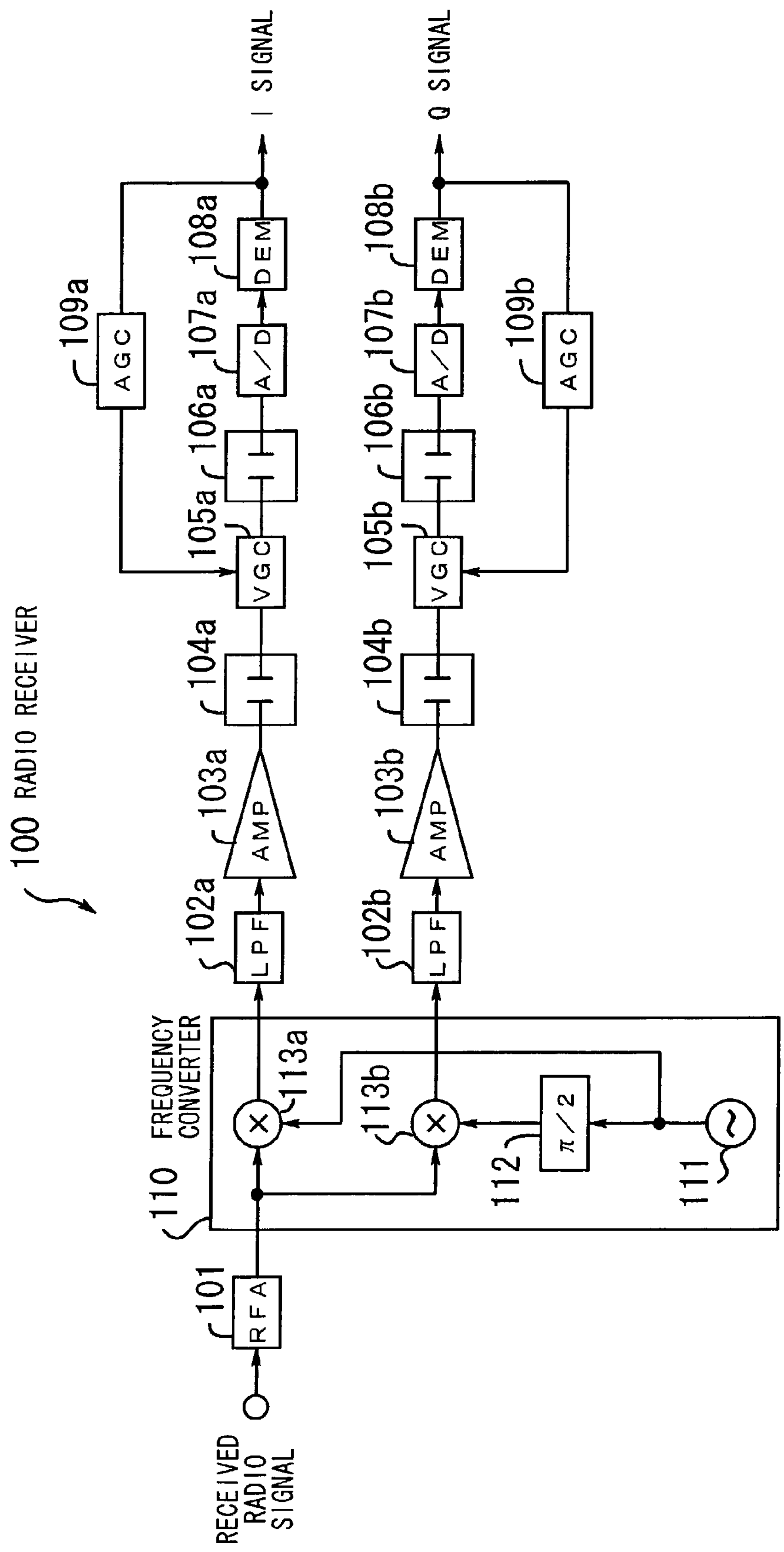
FIG. 15 is a diagram of a conventional radio receiver.

The time constants of the AC couplers 41*a*, 41*b*, 42*a* and 42*b* are set lower than those of the couplers 104*a*, 104*b*, 106*a* and 106*b* of the conventional radio receiver 100 that has been described with reference to FIG. 15.

Figure 7:
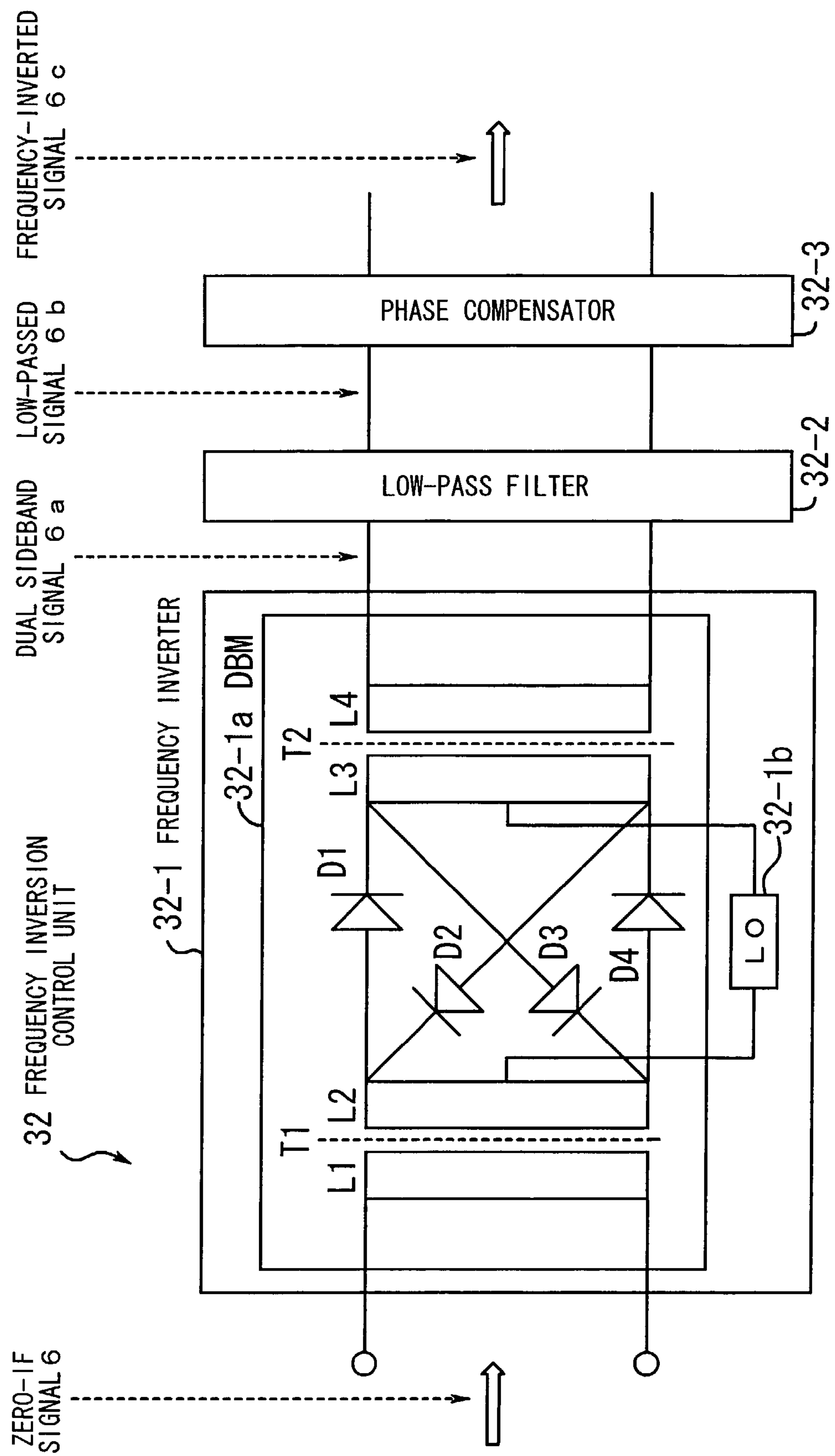
FIG. 7 is a diagram of a structure of a frequency inversion control unit.
Figure 8:
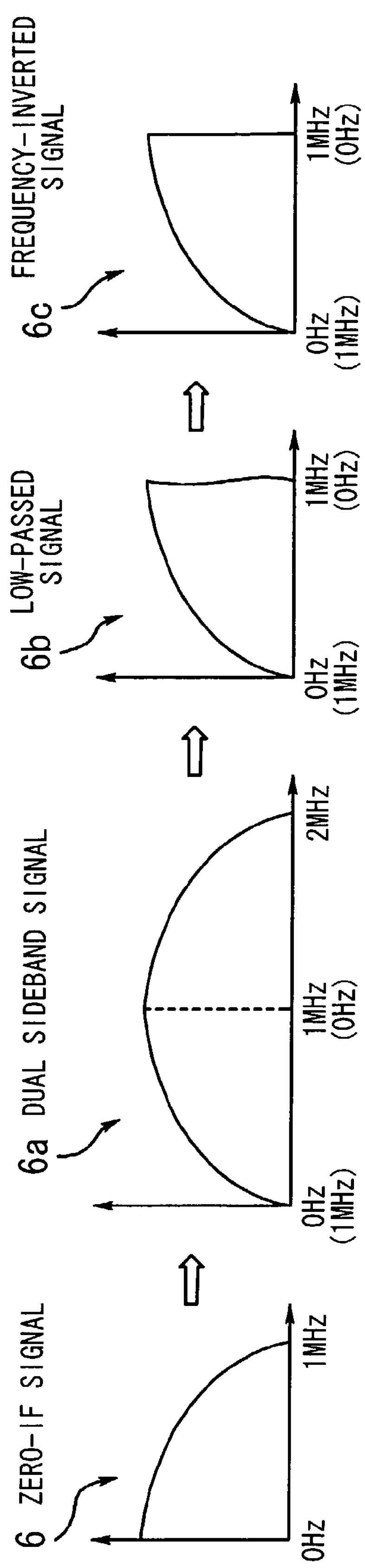
FIG. 8 is a view of waveforms observed in the frequency inversion control unit.

Next, the frequency inversion control unit 32 is described. FIG. 7 shows a structure of the frequency inversion control unit 32, and FIG. 8 shows waveforms of signals observed therein. The frequency inversion control unit 32 is made up of a frequency inverter 32-1, a low-pass filter 32-2, and a phase compensator 32-3. The frequency inverter 32-1 is composed of DBMs (Double Balanced Mixers) 32-1*a* and 32-1*b*.

The DBM 32-1*a* is made up of transformers T1 and T2, and diodes D1–D4. The transformer T1 includes coils L1 and L2, and the transformer T2 includes coils L3 and L4.

The zero-IF signal is applied across the coil L1. The anode of the diode D1 is connected to the cathode of the diode D2 and an end of the coil L2. The cathode of the diode D1 is connected to the anode of the diode D3 and an end of the coil L3.

The anode of the diode D4 is connected to the cathode of the diode D3 and the other end of the coil L2. The cathode of the diode D4 is connected to the anode of the diode D2 and the other end of the coil L3.

The LO 32-1*b* is connected to the connection node of the coils L2 and L3. Input terminals are connected across the coil L1, and the input part of the low-pass filter 32-2 is connected across the coil L4. The output part of the low-pass filter 32-2 is connected to the phase compensator 32-3. A frequency-inverted signal 6*c* is output from the phase compensator 32-3.

The flow of signals is as follows. First, a zero-IF signal 6 is input to the DBM 32-1*a*. It is now assumed that the zero-IF signal 6 has a central frequency of 0 Hz and a bandwidth of 1 MHz that extends from the frequency of 0 Hz.

The DBM 32-1*a* frequency-inverts the zero-IF signal 6 and outputs a resultant dual sideband signal 6*a*. The low-pass filter 32-2 cuts the upper part of the dual sideband signal 6*a* higher than 1 MHz, and produces a resultant low-passed signal 6*b* having a bandwidth of 0 Hz to 1 MHz. The phase compensator 32-3 shapes the waveform of the low-passed signal 6*b*, and results in a frequency-inverted signal 6*c*.

In the foregoing description, the DBM 32-1*a* is used in the frequency inverter 32-1. Alternatively, an unbalanced mixer or a single balanced mixer may be used. It is however required to provide a filter that eliminates output components that are not balanced. The low-pass filter 32-2 may be a rectangular filter that has no inclination at the cutoff frequency, or an inclined filter having an inclination that is not equal to zero at the cutoff frequency.

Figure 9:
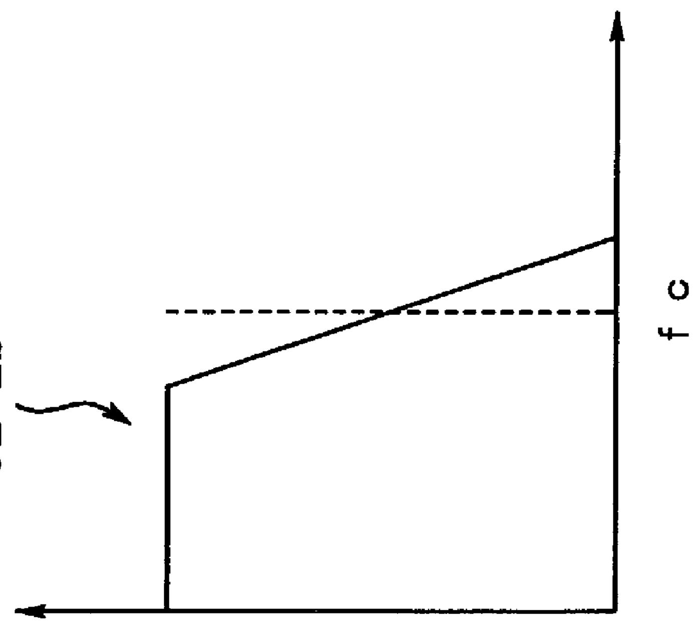
FIG. 9 shows frequency characteristics of a rectangular filter and an inclined filter.
Figure 9:
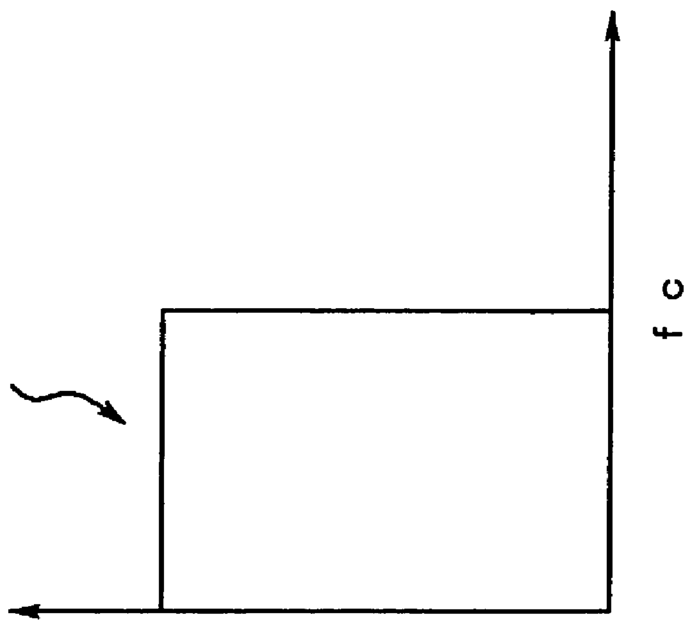

FIG. 9 shows frequency characteristics of the rectangular filter and the inclined filter, in which the horizontal axes denote frequency and the vertical axes denote power. A rectangular filter 32-2*a* is a digital filter formed of DSP (Digital Signal Processor) or the like, and has no inclination at the cutoff frequency fc. An inclined filter 32-2*b* is an analog filter composed of LC, and has a certain inclination (not equal to zero) at the cutoff frequency fc.

Figure 10:
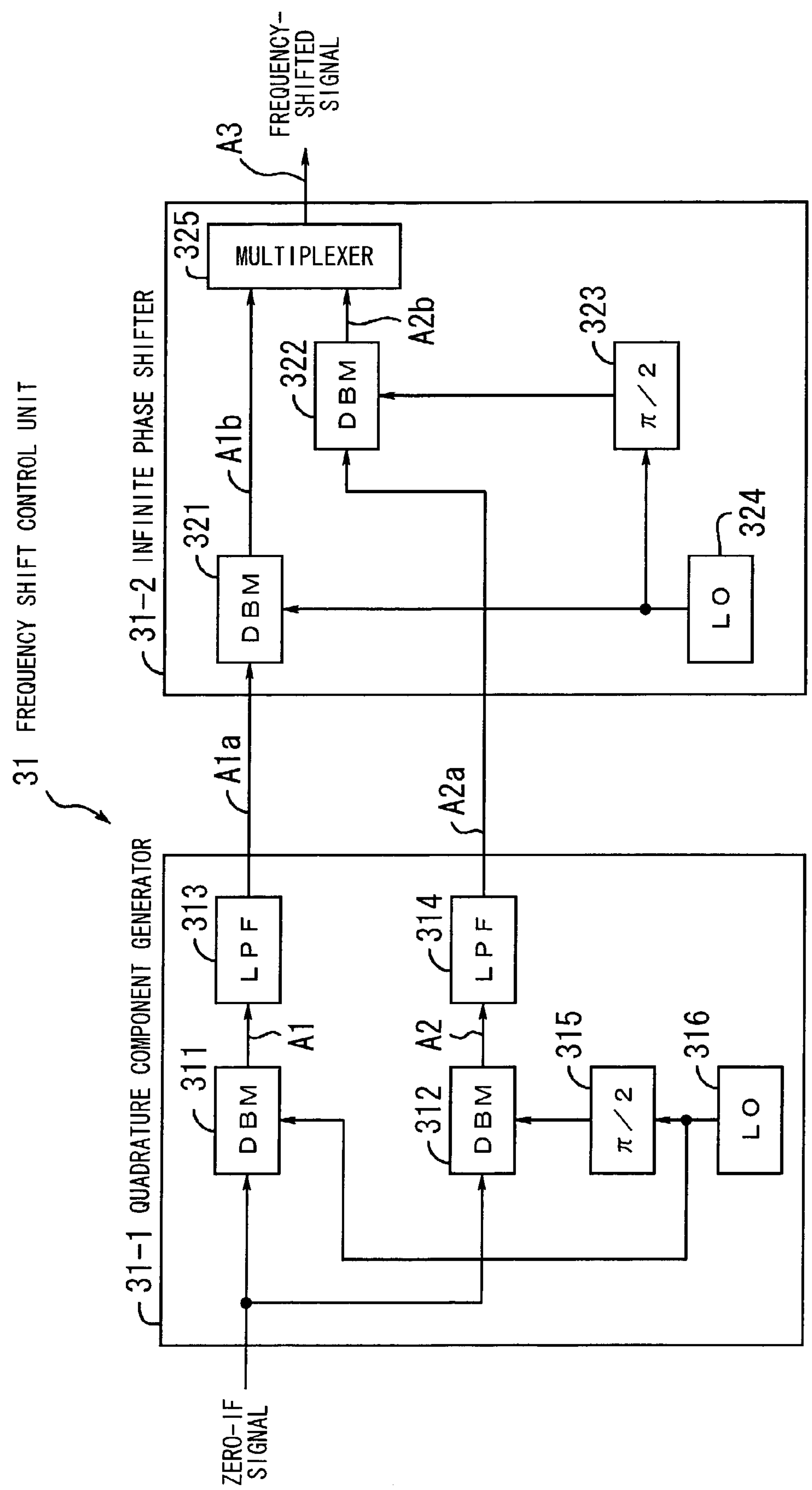
FIG. 10 is a diagram of a frequency shift control unit.

The frequency shift control unit 31 is described. FIG. 10 shows a structure of the frequency shift control unit 31, which is made up of a quadrature component generator 31-1 and an infinite phase shifter 31-2.

The quadrature component generator 31-1 is made up of DBMs 311 and 312, LPFs 313 and 314, a π/2 phase shifter 315, and an LO 316. The infinite phase shifter 31-2 is made up of DBMs 321 and 322, a π/2 phase shifter 323, an LO 324 and a multiplexer 325.

Now, the zero-IF signal that is input to the DBM 311 is represented as cos ωt. The local oscillation frequency of the LO 316 is represented as ω1, and the oscillation signal is represented as cos ω1t. Further, the local oscillation frequency of the LO 324 is represented as ω2, and the oscillation signal is represented as cos ω2t, where ω2>ω1.

An output A1 of DBM 311 is expressed as:

$$A1=\cos(\omega1+\omega)t+\cos(\omega1-\omega)t \quad (1)$$

A signal A1*a* of LPF 313 is as follows:

$$A1a=\cos(\omega1-\omega)t \quad (2)$$

An output A1*b* of DBM 321 is:

$$\begin{aligned} A1b &= \cos(\omega1-\omega)t\cdot\cos\omega2t \quad (3)\\ &= \cos(\omega2+\omega1-\omega)t+\cos(\omega2-\omega1+\omega)t \end{aligned}$$

An output A2 of DBM 312 is:

$$A2=\sin(\omega1+\omega)t+\sin(\omega1-\omega)t \quad (4)$$

An output A2*a* after LPF 314 is:

$$A2a=\sin(\omega1-\omega)t \quad (5)$$

An output A2*b* of DBM 322 is:

$$\begin{aligned} A2b &= \sin(\omega2+\omega)t\cdot\sin\omega2t \quad (6)\\ &= \sin(\omega2-\omega1+\omega)t+\sin(\omega2+\omega1-\omega) \end{aligned}$$

An output A3 of the multiplexer 325 is written as follows:

$$\begin{aligned} A3 &= A1b+A2b \quad (7)\\ &= (\cos(\omega2+\omega1-\omega)t+\cos(\omega2-\omega1+\omega)t)+\\ &\quad (\sin(\omega2-\omega1+\omega)t+\sin(\omega2+\omega1-\omega)t)\\ &= \cos((\omega2-\omega1)+\omega))t \end{aligned}$$

As described above, the zero-IF signal of cos ωt is converted into the frequency-shifted signal of cos((ω2−ω1)+ω)t that has shifted towards the upper side of the frequency band by Δf=(ω2−ω1) by the frequency shift control unit 31.

Figure 11:
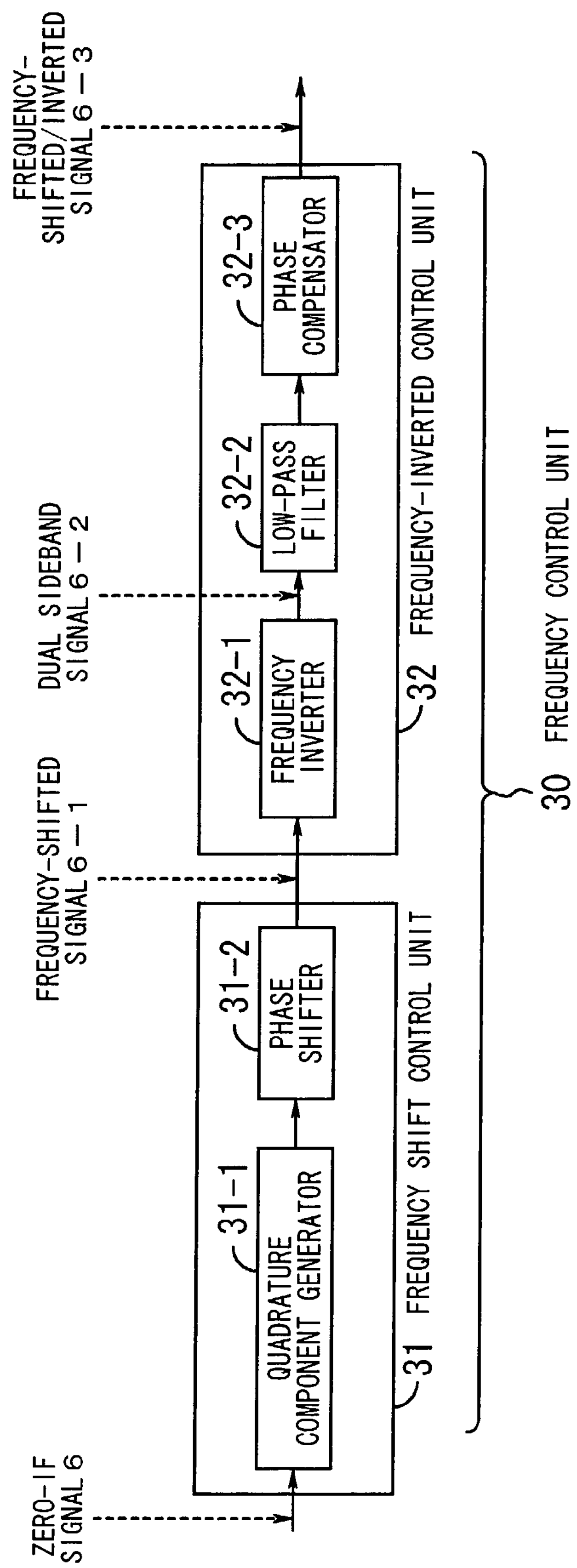
FIG. 11 is a diagram of a structure in the combination of the frequency shift control unit and the frequency inversion control unit.
Figure 12:
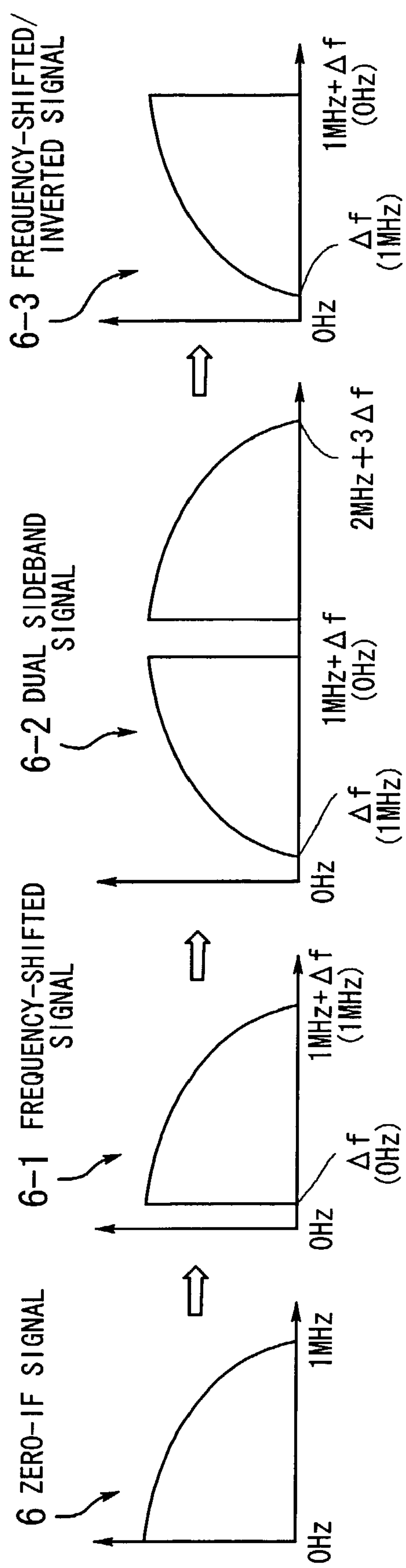
FIG. 12 is a view of waveforms.

A description will now be given of a configuration and waveforms in the combination of the frequency shift control unit 31 and the frequency inversion control unit 32. FIG. 11 shows a structure in the combination of the frequency shift control unit 31 and the frequency inversion control unit 32. FIG. 12 shows waveforms of signals in the unit 31.

The frequency control unit 30 is made up of the frequency shift control unit 31 and the frequency inversion control unit 32. The frequency shift control unit 31 is composed of the quadrature component generator 31-1 and the infinite phase shifter 31-2. The frequency inversion control unit 32 is composed of the frequency inverter 32-1, the low-pass filter 32-2 and the phase compensator 32-3.

The zero-IF signal 6 is input to the frequency shift control unit 31. It is assumed that the zero-IF signal 6 has a central frequency of 0 MHz and a bandwidth of 1 MHz upwards.

The frequency shift control unit 31 performs the frequency shift control of the zero-IF signal 6, and results in the frequency-shifted signal 6-1 that has shifted upwards by Δf. The frequency-shifted signal 6-1 is then input to the frequency inverter 32-1. The frequency inverter 32-1 performs inverting processing for the frequency-shifted signal 6-1, and results in a dual sideband signal 6-2.

The dual sideband signal 6-2 is input to the low-pass filter 32-2. The low-pass filter 32-2 and the phase compensator 32-3 allow only the lower sideband of the dual sideband signal 6-2 to pass therethrough, and shapes the waveform thereof, resulting in the frequency-shifted/inverted signal 6-3. In the embodiment, the zero-IF signal is subjected to the frequency shift and the frequency inversion in that order. Alternatively, the zero-IF signal may be subjected to the frequency inversion and the frequency shift in that order.

Figure 13:
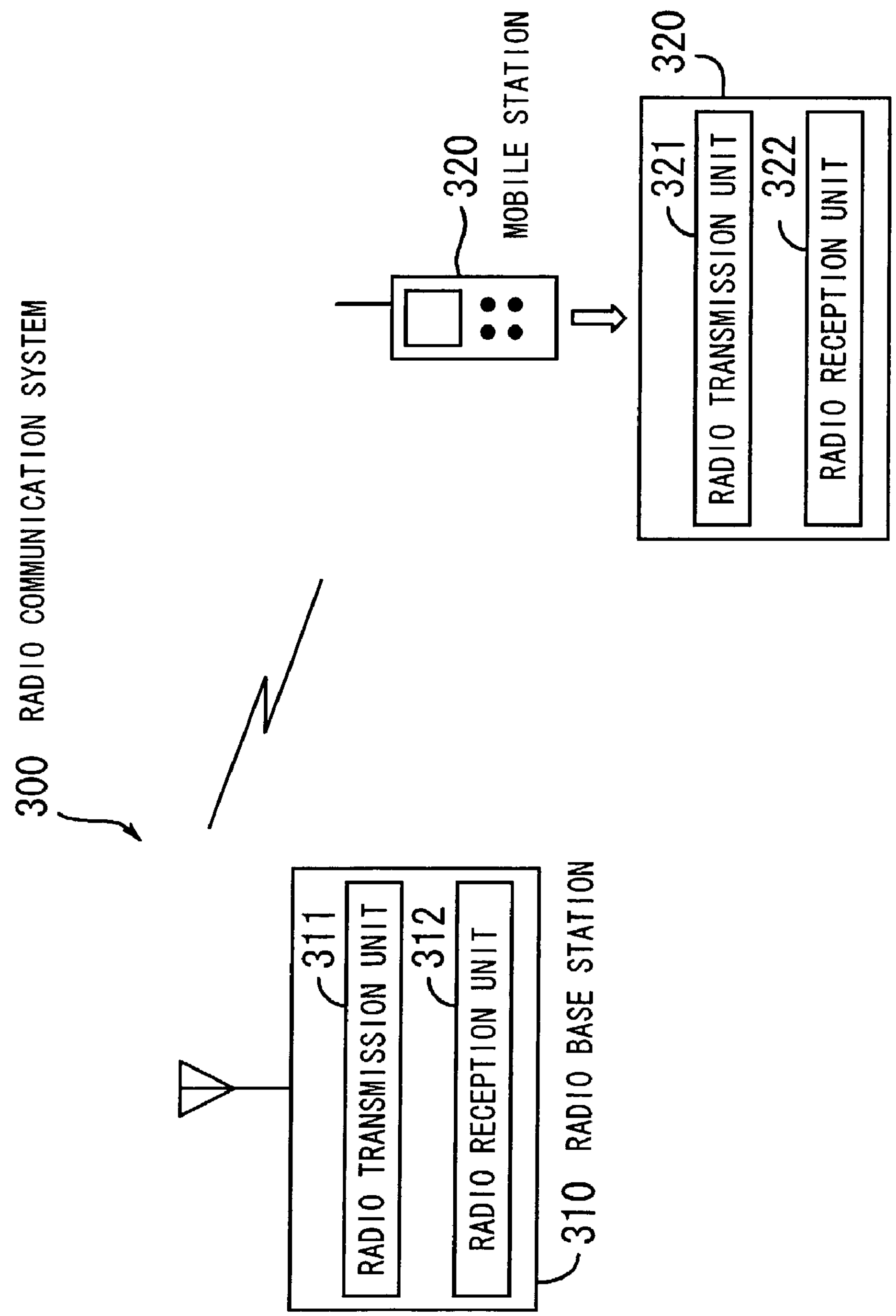
FIG. 13 is a diagram of a configuration of a radio communication system.

Next, a description will be given of a radio communication system to which the radio communication device 1 of the present invention is applied. FIG. 13 shows a structure of the radio communication system. A radio communication system 300 includes a radio base station 310 and a mobile station 320. The radio base station 310 has a radio transmission unit 311 that transmits modulates a signal and transmits a resultant radio signal, and a radio reception unit 312. The mobile station 320 includes a radio transmission unit 321 that modulates a signal and transmits a resultant radio signal, and a radio reception unit 322. The radio reception units 312 and 322 are configured as the radio communication device 1 of the present invention.

By providing the radio base station 310 and the mobile station 320 with the reception part of the radio communication device 1, it is possible to realize high-quality communication control. The radio communication system 300 may, for example, be those of various systems such as CDMA.

As described above, the radio receiver 1 of the present invention performs at least one of the frequency shift control that shifts the intermediate frequency signal towards the upper part of the frequency band and the frequency inversion control that inverts the low-frequency side of the intermediate signal towards the upper part of the frequency band and inverts the high-frequency side thereof towards the lower part thereof, and cuts the DC component at a high cutoff frequency for demodulation.

It is thus possible to suppress a DC fluctuation due to the setting of the high cutoff frequency for the zero-IF signal even if there is great variation in the electric field and to surely capture the components located at the central frequency of 0 Hz and frequencies close thereto for demodulation.

The foregoing description is given as if each structural part has an analog configuration. Alternatively, each structural part may be configured in digital fashion by using, for example, DSP.

As described above, the radio receiver of the present invention is configured in such a way as to perform at least one of the frequency shift control that shifts the intermediate frequency signal towards the upper part of the frequency band and the frequency inversion control that inverts the low-frequency side of the intermediate frequency signal towards the upper part of the frequency band and inverts the high-frequency side thereof towards the lower part thereof, and cuts the DC component at a high cutoff frequency for demodulation. It is thus possible to prevent suppression of the low-frequency components even if the cutoff frequency is set high and to thus realize high-quality reception control of the radio signal.

Also, the radio communication system of the present invention is configured in such a way as to perform at least one of the frequency shift control that shifts the intermediate frequency signal towards the upper part of the frequency band and the frequency inversion control that inverts the low-frequency side of the intermediate signal towards the upper part of the frequency band and inverts the high-frequency side thereof towards the lower part thereof, and cuts the DC component at a high cutoff frequency for demodulation. It is thus possible to prevent suppression of the low-frequency components even if the cutoff frequency is set high and to thus realize high-quality reception control of the radio signal.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A radio receiver performing reception control of a radio signal comprising:

a radio signal amplifier, a frequency converter, an I-signal generator and a Q-signal generator:

wherein the radio signal amplifier amplifies a received radio signal and generates an amplified signal, wherein the frequency converter mixes the amplified signal with a local oscillation signal to thereby convert the radio signal having a radio frequency into a first intermediate frequency signal, and mixes the amplified signal with a local oscillation signal shifted by $\pi/2$ by a $\pi/2$ phase shifter to thereby convert the radio signal having a radio frequency into a second intermediate frequency signal, wherein the I-signal generator includes a first frequency control part, a first AC coupling part and a first radio signal demodulating part, wherein the first frequency control part, including at least one of a frequency shift controller for shifting the first intermediate frequency signal towards an upper part of a frequency band and a frequency inversion controller for inverting a low-frequency side of the first intermediate frequency signal towards the upper part of the frequency band and inverting a high-frequency side thereof towards a lower part thereof, performs frequency control of the first intermediate frequency signal and avoids loss of energy of low-frequency components of the first intermediate frequency signal due to AC coupling being set at a first high cutoff frequency, wherein the first AC coupling part provided at an output side of the first frequency control part is set at the first high cutoff frequency to suppress DC fluctuation from the first intermediate frequency signal, wherein the first radio signal demodulating part demodulates an output signal obtained via the first AC coupling part and generates an I-signal, wherein the Q-signal generator includes a second frequency control part, a second AC coupling part and a second radio signal demodulating part, wherein the second frequency control part, including at least one of a frequency shift controller for shifting the second intermediate frequency signal towards an upper part of a frequency band and a frequency inversion controller for inverting a low-frequency side of the second intermediate frequency signal towards the upper part of the frequency band and inverting a high-frequency side thereof towards a lower part thereof, performs frequency control of the second intermediate frequency signal and avoids loss of energy of low-frequency components of the second intermediate frequency signal due to AC coupling being set at a second high cutoff frequency, wherein the second AC coupling part provided at an output side of the second frequency control part is set at the second high cutoff frequency to suppress DC fluctuation from the second intermediate frequency signal, and wherein the second radio signal demodulating part demodulates an output signal obtained via the second AC coupling part and generates a Q-signal.

2. The radio receiver according to claim 1, wherein the first and second frequency control parts perform frequency control of a zero-IF signal having a central frequency of zero as the first and second intermediate signal.

3. The radio receiver according to claim 1, wherein the frequency shift controller included in the first and second frequency control part respectively comprises a quadrature component generator and an infinite phase shifter.

4. The radio receiver according to claim 1, where the frequency inversion controller included in the first and second frequency control part respectively comprises a double balanced mixer, a local oscillator, a low-pass filter, and a phase compensator.

5. The radio receiver according to claim 4, wherein the low-pass filter included in the first and second frequency control part respectively is a rectangular filter that has an inclination of zero at a cutoff frequency.

6. The radio receiver according to claim 4, wherein the low-pass filter included in the first and second frequency control part respectively is an inclined filter having an inclination that is not equal to zero at a cutoff frequency.

7. A radio communication system performing communication control of a radio signal comprising:

a radio base station having a first radio transmission unit and a first radio reception unit; and a mobile station having a second radio transmission unit and a second radio reception unit, each of the first and second radio transmission units modulating a signal and resulting in a radio signal, each of the first and second radio reception units comprising a radio signal amplifier, a frequency converter, an I-signal generator and a Q-signal generator, wherein the radio signal amplifier amplifies a received radio signal and generates an amplified signal, wherein the frequency converter mixes the amplified signal with a local oscillation signal to thereby convert the radio signal having a radio frequency into a first intermediate frequency signal, and mixes the amplified signal with a local oscillation signal shifted by π/2 by a π/2 phase shifter to thereby convert the radio signal having a radio frequency into a second intermediate frequency signal, wherein the I-signal generator includes a first frequency control part, a first AC coupling part and a first radio signal demodulating part, wherein the first frequency control part, including at least one of a frequency shift controller for shifting the first intermediate frequency signal towards an upper part of a frequency band and a frequency inversion controller for inverting a low-frequency side of the first intermediate frequency signal towards the upper part of the frequency band and inverting a high-frequency side thereof towards a lower part thereof, performs frequency control of the first intermediate frequency signal and avoids loss of energy of the first intermediate frequency signal due to AC coupling being set at a first high cutoff frequency, wherein the first AC coupling part provided at an output side of the first frequency control part is set at the first high cutoff frequency to suppress DC fluctuation from the first intermediate frequency signal, wherein the first radio signal demodulating part demodulates an output signal obtained via the first AC coupling part and generates an I-signal, wherein the Q-signal generator includes a second frequency control part, a second AC coupling part and a second radio signal demodulating part, wherein the second frequency control part, including at least one of a frequency shift controller for shifting the second intermediate frequency signal towards an upper part of a frequency band and a frequency inversion controller for inverting a low-frequency side of the second intermediate frequency signal towards the upper part of the frequency band and inverting a high-frequency side thereof towards a lower part thereof, performs frequency control of the second intermediate frequency signal and avoids loss of energy of the second intermediate frequency signal due to AC coupling being set at a second high cutoff frequency, wherein the second AC coupling part provided at an output side of the second frequency control part is set at the second high cutoff frequency to suppress DC fluctuation from the second intermediate frequency signal, and wherein the second radio signal demodulating part demodulates an output signal obtained via the second AC coupling part and generates a Q-signal.

* * * * *